(12) United States Patent
Liao et al.

(10) Patent No.: US 8,366,476 B2
(45) Date of Patent: Feb. 5, 2013

(54) ELECTRICAL CONNECTOR WITH IMPROVED ALIGNMENT STRUCTURE

(75) Inventors: Fang-Jwu Liao, Tu-Cheng (TW); Chun-Yi Chang, Tu-Cheng (TW)

(73) Assignee: Hon Hai Precision Ind, Co., Ltd., New Taipei (TW)

( * ) Notice: Subject to any disclaimer, the term of this patent is extended or adjusted under 35 U.S.C. 154(b) by 143 days.

(21) Appl. No.: 12/944,657

(22) Filed: Nov. 11, 2010

(65) Prior Publication Data

US 2012/0115350 A1 May 10, 2012

(30) Foreign Application Priority Data

Nov. 8, 2010 (TW) ................................ 99221538 U

(51) Int. Cl.
*H01R 13/64* (2006.01)
(52) U.S. Cl. .......................................... 439/374; 439/378
(58) Field of Classification Search ................. 439/374, 439/296, 378, 71, 66
See application file for complete search history.

(56) References Cited

U.S. PATENT DOCUMENTS

| | | | | |
|---|---|---|---|---|
| 5,466,171 A * | 11/1995 | Bixler et al. | ................. | 439/378 |
| 5,885,088 A * | 3/1999 | Brennan et al. | ............... | 439/680 |
| 6,659,795 B1 * | 12/2003 | Lai et al. | ....................... | 439/526 |
| 7,377,791 B2 * | 5/2008 | Liao et al. | ....................... | 439/71 |
| 7,581,963 B2 * | 9/2009 | Liao | ............................. | 439/71 |
| 7,922,514 B2 * | 4/2011 | Liao | ............................. | 439/378 |
| 2006/0079113 A1 * | 4/2006 | Minich | ........................ | 439/378 |
| 2009/0017671 A1 * | 1/2009 | Liao | ............................. | 439/378 |

* cited by examiner

*Primary Examiner* — Hae Moon Hyeon
(74) *Attorney, Agent, or Firm* — Wei Te Chung; Ming Chieh Chang

(57) ABSTRACT

An electrical connector includes a rectangular insulative housing having a number of passageways and a number of electrical contacts retained in the passageways, respectively. The insulative housing defines a first alignment hole and a second alignment hole on a diagonal line thereof. The first alignment hole has a pair of flat surfaces extending along the diagonal line and a pair of curved surfaces connected with the flat surfaces for engaging with a mating post to position the electrical connector on a printed circuit board.

20 Claims, 7 Drawing Sheets

ELECTRICAL CONNECTOR WITH IMPROVED ALIGNMENT STRUCTURE

BACKGROUND OF THE INVENTION

1. Field of the Invention

The present invention relates to an electrical connector mounted to a printed circuit board.

2. Description of Related Art

Electrical connectors are widely used to connect two different electronic elements, such as a package and a printed circuit board. Generally, the electrical connector comprises a plurality of the electrical contacts which connect with the printed circuit board at one end and contact with the package at the other end. High speed and low profile are two development trends of the electronic elements; the electrical connectors also confront these challenges. To satisfy these trends, the density of the electrical contacts is increased which arises one problem, i.e. how to align the large number of electrical contacts with corresponding pads on the printed circuit board.

A conventional alignment structure is to integrated form a plurality of posts on an insulative housing of the electrical connector. The printed circuit board is provided with a plurality of holes corresponding to the posts. The posts are arranged on the electrical connector which increases the height thereof and is adverse to the low profile development trend. Another structure is the electrical connector and the printed circuit board each defines a plurality of circular holes for engaging with a number of posts. The electrical connector may also provide a plurality of spring tabs in the holes for increasing flexibility. After assembling, the post extends through the electrical connector and the printed circuit board from up to down. Since the hole is circular, the displacement of the electrical connector can be adjusted only along a radial direction of the hole and is very small so that the post is difficult to assemble to the electrical connector. In addition, the manufacture tolerance of the electrical connector also affects the engagement between the post and the hole. Therefore, the manufacture demand must be improved for obviating the influence of the tolerance. However, the cost of the electrical connector is increased accordingly.

An improved electrical connector that overcomes the above-mentioned problems is desired.

BRIEF SUMMARY OF THE INVENTION

An object of the present invention is to provide an electrical connector which is easy to assemble and disassemble.

An electrical connector comprises a rectangular insulative housing having a plurality of passageways extending therethrough and a plurality of electrical contacts retained in the passageways, respectively. The insulative housing defines a first alignment hole and a second alignment hole on a diagonal line thereof. The first alignment hole has a pair of flat surfaces extending along the diagonal line and a pair of curved surfaces connected with the flat surfaces.

An electrical connector comprises an insulative housing having a plurality of passageways extending therethrough and a plurality of electrical contacts retained in the passageways, respectively. The insulative housing defines a first alignment hole and a second alignment hole different from each other. The first alignment hole has a pair of flat surfaces and a pair of curved surfaces connected with the flat surfaces.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
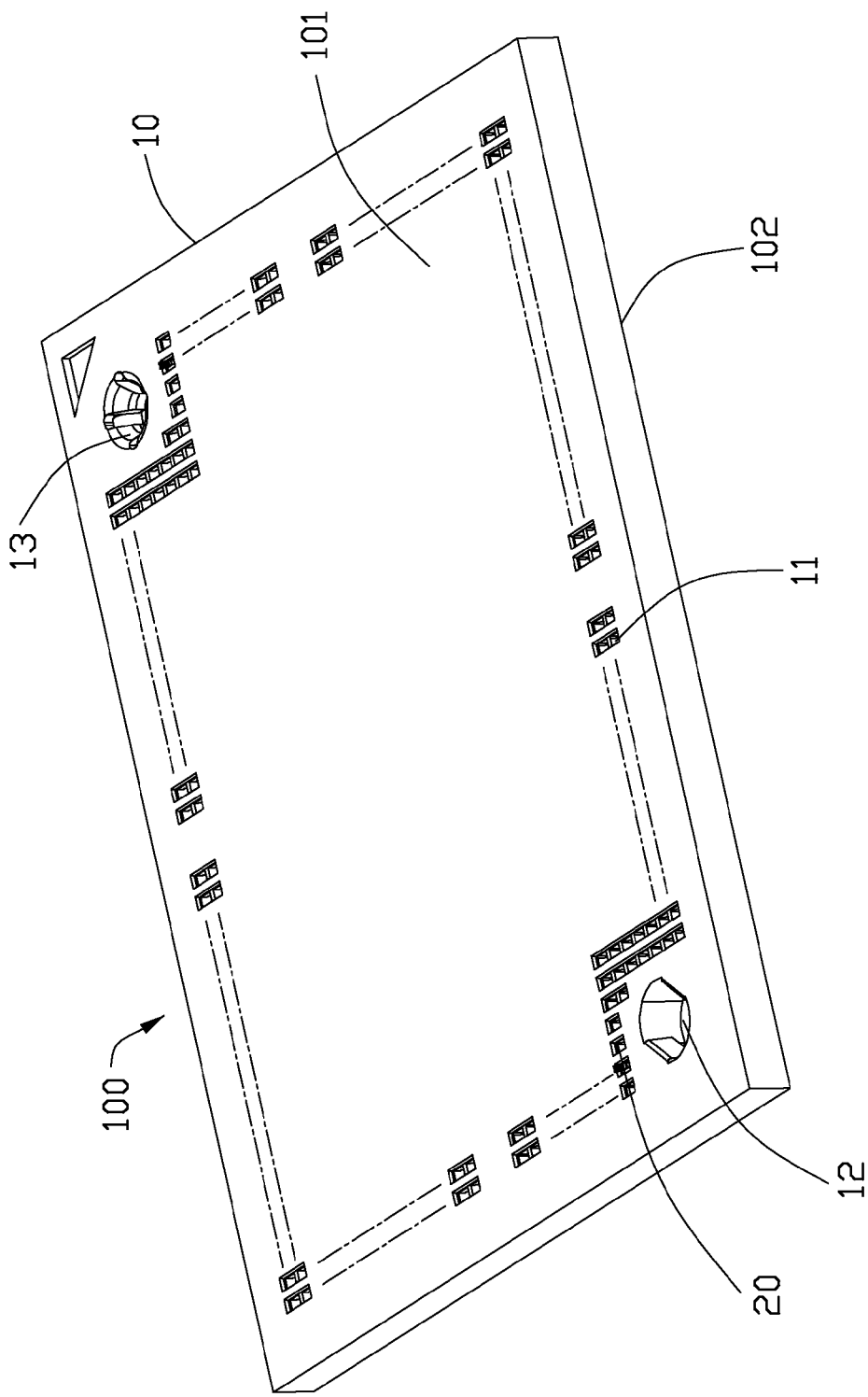
FIG. 1 is an assembled, perspective view of an electrical connector according to a first embodiment of the present invention.

Reference will be made to the drawing figures to describe the present invention in detail, wherein depicted elements are not necessarily shown to scale and wherein like of similar elements are designated by same or similar reference numeral through the several views and same or similar terminology.

Please referring to FIGS. 1-6, an electrical connector 100 according to a preferred embodiment of the present invention is used to electrically connect a package (not shown) with a printed circuit board (not shown) and comprises a rectangular insulative housing 10 and a plurality of electrical contacts 20 secured to the insulative housing 10. The insulative housing 10 has a top surface 101 and a bottom surface 102 opposite to each other and defines a plurality of passageways 10 extending therethrough. The plurality of passageways 10 are arranged in a longitudinal direction and a transverse direction perpendicular to each other and a contact area is essentially defined by the longitudinal direction and the transverse direction. The electrical contacts 20 are retained in the passageways 11, respectively, and each has an upper contact portion 21 extending beyond the top surface 101 for connecting with the package and a lower contact portion 22 extending beyond the bottom surface 102 of the insulative housing 10 for mounting to the printed circuit board.

Figure 2:
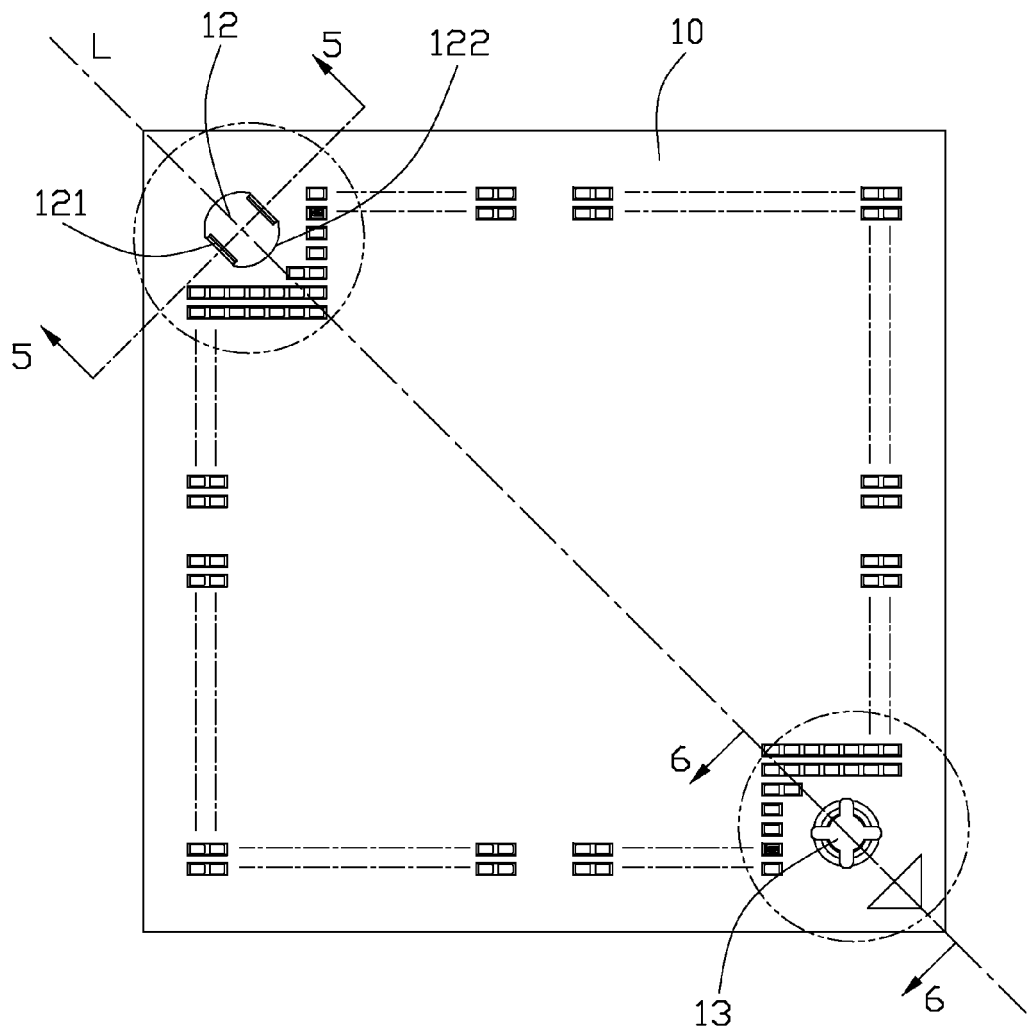
FIG. 2 is a top view of the electrical connector shown in FIG. 1.
Figure 3:
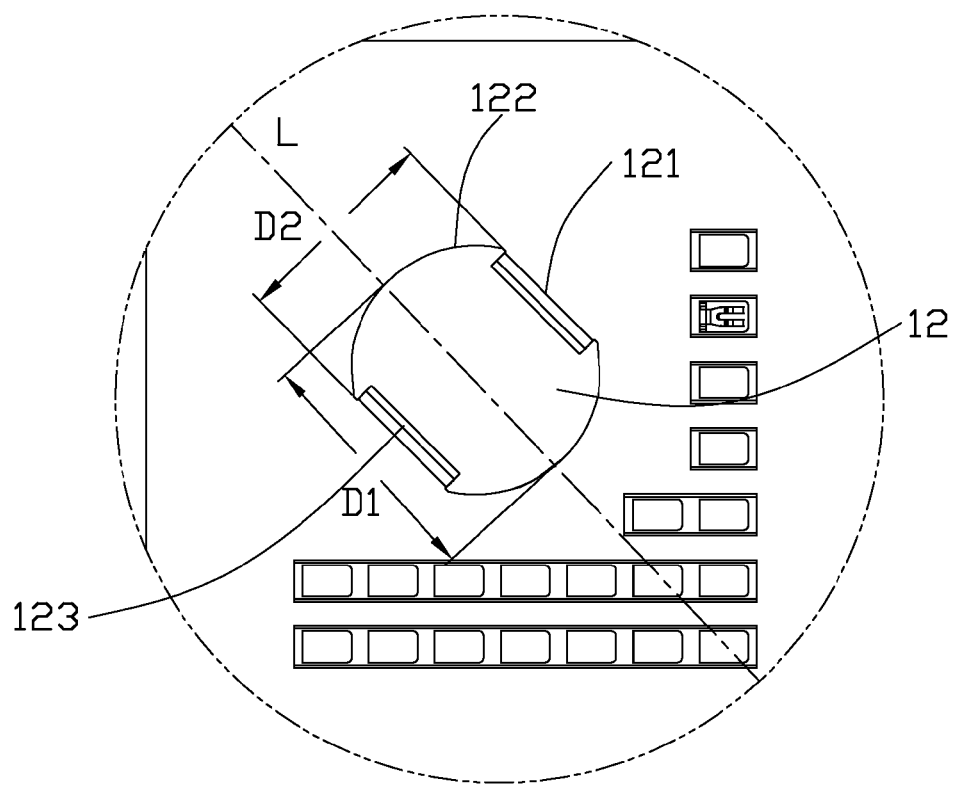
FIG. 3 is an enlarged view of an upper left circle portion shown in FIG. 2.
Figure 4:
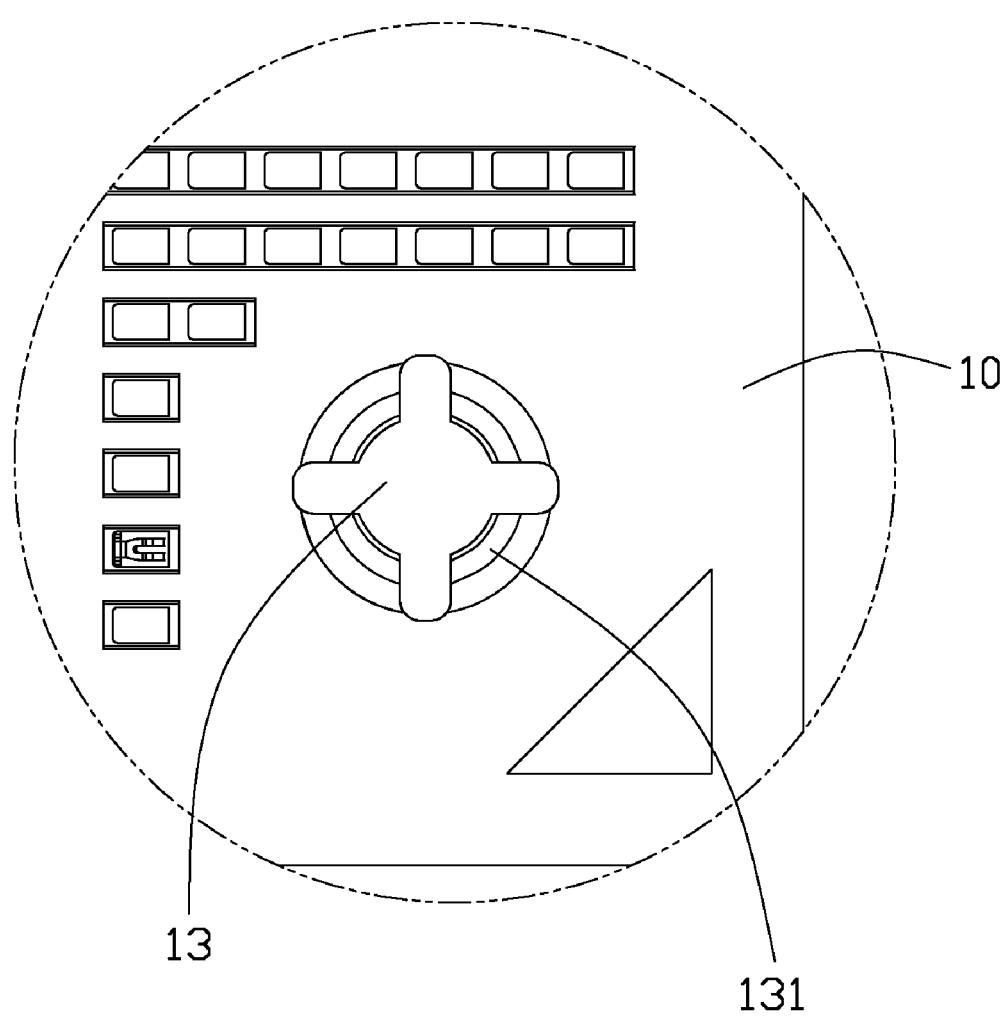
FIG. 4 is an enlarged view of a lower right circle portion shown in FIG. 2.

With reference to FIGS. 2-4, the insulative housing 10 has a first alignment hole 12 and a second alignment hole 13 on a diagonal line L thereof. The first alignment hole 12 and the second alignment hole 13 are located at two corners of the insulative housing 10 and extend therethrough. The first alignment hole 12 and the second alignment hole 13 have different shapes. The first alignment hole 12 has a pair of flat surfaces 121 extending along the diagonal line L and a pair of curved surfaces 122 connected with the flat surfaces 121. The first alignment hole 12 has a pair of spring tabs 123 extending downwardly from a top edge thereof and facing the pair of flat surfaces 121, respectively. A first dimension D1 of the first alignment hole 12 in the diagonal line L is greater than a second dimension D2 of the first alignment hole 12 in a perpendicular line (not shown) of the alignment line L. The second alignment hole 13 is circular and has a plurality of spring tabs 131 extending downwardly from a top edge thereof and located therein.

Figure 5:
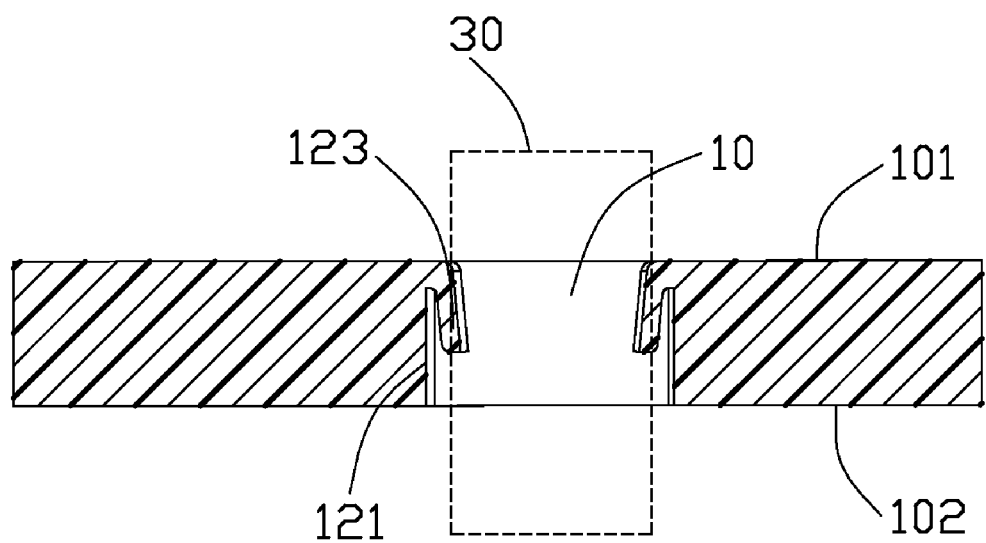
FIG. 5 is a cross-sectional view of the electrical connector taken along line 5-5 in FIG. 2.
Figure 6:
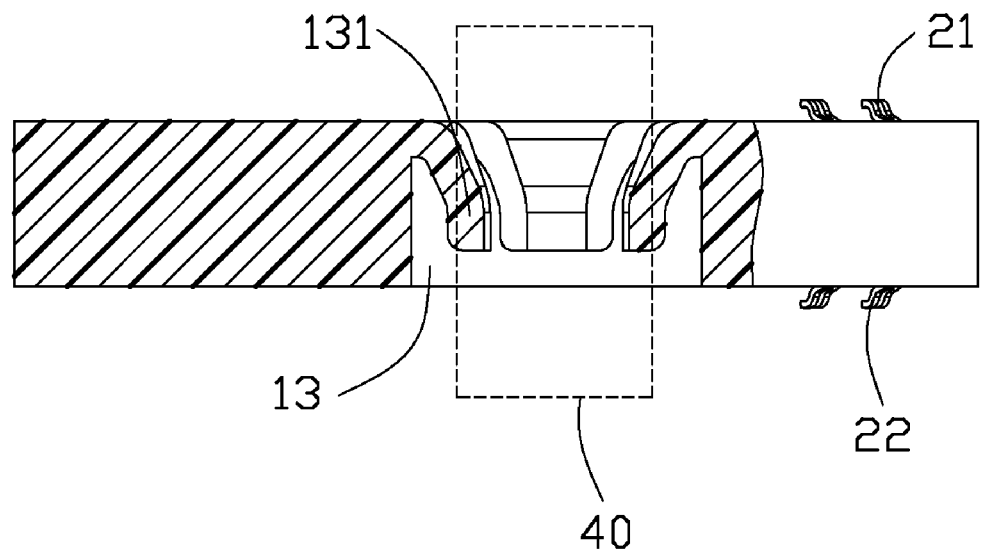
FIG. 6 is a cross-sectional view of the electrical connector taken along line 6-6 in FIG. 2.

Referring to FIGS. 5-6, the dash lines illustrate two circular mating posts 30, 40 engaging with the first alignment hole 12 and the second alignment hole 13 when the electrical connector 100 is mounted to the printed circuit board (not shown). The spring tabs 123, 131 in the first alignment hole 12 and the second alignment hole 13 can provide a good flexibility when the posts 30, 40 mate with the insulative housing 10. A diameter of the post 30 is essentially equal to the second dimension D2 of the first alignment hole 12 and the post 30 can slide along the pair of flat surfaces 121. The flat surfaces 121 are arranged along the diagonal line L so that the insulative housing 10 achieves a bigger displacement in the diagonal line L than a circular hole during the post 30 is inserted into the first alignment hole 12. Therefore, the first alignment hole 12 can absorb the manufacture tolerance of the insulative housing 10 and decrease the manufacture demand. In addition, it is easy to assemble and disassemble the mating posts 30, 40.

Figure 7:
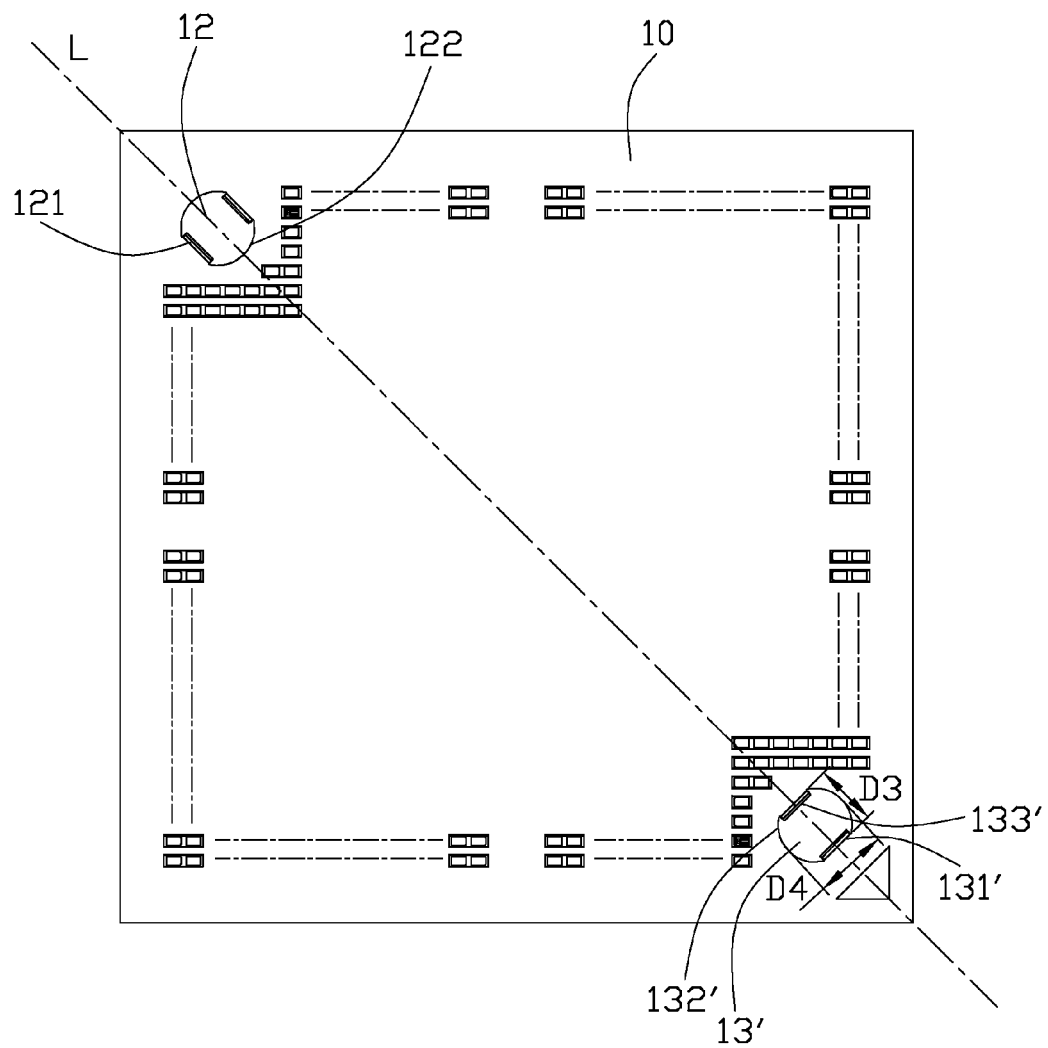
FIG. 7 is a top view of an electrical connector according to a second embodiment of the present invention.

With reference to FIG. 7, which shows a second embodiment in accordance with the present invention, the first alignment hole 12 and the second alignment hole 13' are located at two corners of the insulative housing 10 and extend therethrough. The first alignment hole 12 and the second alignment hole 13' have same shape and different arrangements on the insulative housing 10. The first alignment hole 12 has a pair of flat surfaces 121 extending along the diagonal line L and a pair of curved surfaces 122 connected with the flat surfaces 121. The second alignment hole 13' also has a pair of flat surfaces 131' perpendicular to the diagonal line L and a pair of curved surfaces 132' connected with the flat surfaces 131'. A pair of spring tabs 133' extending downwardly from a top edge of the second alignment hole 13' and facing the pair of flat surfaces 131'. A third dimension D3 of the second alignment hole 13' in the diagonal line L is lesser than a fourth dimension D4 of the second alignment hole 13' in a perpendicular line (not shown) of the alignment line L.

The flat surfaces 121 of the first alignment hole 12 and the flat surfaces 131' of the second alignment hole 13' provide the insulative housing 10 a bigger displacement in two directions, one is along the diagonal line L and the other is along the perpendicular line of the diagonal line L. Therefore, the first alignment hole 12 and second alignment hole 13' can absorb the manufacture tolerance of the insulative housing 10 and decrease the manufacture demand. In addition, it is easy to assemble and disassemble the mating posts 30, 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector comprising:
   a rectangular insulative housing having a plurality of passageways extending therethrough, the insulative housing defining a first alignment hole and a second alignment hole on a diagonal line thereof, the first alignment hole having a pair of flat surfaces extending along the diagonal line and a pair of curved surfaces connected with the flat surfaces; and
   a plurality of electrical contacts retained in the passageways, respectively;
   wherein a first dimension of the first alignment hole in the diagonal line is greater than a second dimension of the first alignment hole in a perpendicular line of the diagonal line; and
   a circular post is inserted into the first alignment hole and a diameter of the post is essentially equal to the second dimension of the first alignment hole.

2. The electrical connector according to claim 1, wherein the second alignment hole is circular, and a plurality of spring tabs extend downwardly from a top edge of the second alignment hole and are located therein.

3. The electrical connector according to claim 1, wherein the first alignment hole has a pair of spring tabs extending downwardly from a top edge thereof and facing the pair of flat surfaces.

4. The electrical connector according to claim 1, wherein the second alignment hole has a pair of flat surfaces perpendicular to the diagonal line and a pair of curved surfaces connected with the flat surfaces.

5. The electrical connector according to claim 4, wherein the second alignment hole has a pair of spring tabs extending downwardly from a top edge thereof and facing the pair of flat surfaces.

6. The electrical connector according to claim 4, wherein a third dimension of the second alignment hole in the diagonal line is lesser than a fourth dimension of the second alignment hole in a perpendicular line of the diagonal line.

7. The electrical connector according to claim 1, wherein the electrical contacts each has an upper contact portion extending beyond a top surface of the insulative housing and a lower contact portion extending beyond a bottom surface of the insulative housing.

8. An electrical connector comprising:
   an insulative housing having a plurality of passageways extending therethrough, the insulative housing defining a first alignment hole and a second alignment hole different from each other, the first alignment hole having a pair of flat surfaces and a pair of curved surfaces connected with the flat surfaces, the first alignment hole being configured to receive a post and said post having a displacement along the pair of flat surfaces; and
   a plurality of electrical contacts retained in the passageways, respectively.

9. The electrical connector according to claim 8, wherein the first alignment hole and the second alignment hole are located on a diagonal line of the insulative housing, and wherein the flat surfaces of the first alignment hole extend along the diagonal line.

10. The electrical connector according to claim 9, wherein the second alignment hole is circular.

11. The electrical connector according to claim 9, wherein a first dimension of the first alignment hole in the diagonal line is greater than a second dimension of the first alignment hole in a perpendicular line of the diagonal line.

12. The electrical connector according to claim 9, wherein the second alignment hole has a pair of flat surfaces perpendicular to the diagonal line and a pair of curved surfaces connected with the flat surfaces.

13. The electrical connector according to claim 12, wherein a third dimension of the second alignment hole in the diagonal line is lesser than a fourth dimension of the second alignment hole in a perpendicular line of the diagonal line.

14. The electrical connector according to claim 8, wherein the first and second alignment holes each has a plurality of spring tabs extending from a top edge thereof and into the first and second alignment hole.

15. An electrical connector comprising:
   an insulative housing including a contact area essentially defined by a longitudinal direction and a transverse direction perpendicular to each other, with at least one alignment hole around a corner of a periphery of said contact area, said alignment hole defining in a top view an orientation direction oblique to both said longitudinal direction and said transverse direction; wherein a spring tab unitarily extends from a section of a rim of said alignment hole and roughly along a corresponding interior surface of said alignment hole into said alignment hole under condition that said spring tab is deflectable in a deflection direction perpendicular to said orientation direction; and no spring tab unitarily extends from another section of the rim of the alignment hole along the corresponding interior surface of the alignment hole under condition said another section is located at a position in the orientation direction of said alignment hole for allowing a circular post, which is adapted to be received in the alignment hole, to be restricted by the spring tab in the deflection direction while being more freely displaceable in the alignment hole along the orientation direction so as to forgive greater manufacturing tolerance.

16. The electrical connector as claimed in claim 15, further including another spring tab unitarily extending from another section of the rim opposite to said section and into the alignment hole and being deflectable in said deflection direction for cooperating with said spring tab to sandwich therebetween an alignment post inserted into the alignment hole.

17. The electrical connector as claimed in claim 15, wherein said section essentially is a straight line and said corresponding interior surface is essentially a flat plane, and both of said straight line and said corresponding interior surface are parallel to said orientation direction.

18. The electrical connector as claimed in claim 15, wherein said orientation direction is essentially close to a diagonal direction of said housing.

19. The electrical connector as claimed in claim 15, wherein said housing further defines another alignment hole spaced from said alignment hole along said orientation direction.

20. The electrical connector as claimed in claim 19, wherein said another alignment is equipped with another spring tab which is located at thereof a section in said orientation section so as to be deflectable in said orientation direction.

* * * * *